United States Patent [19]

Haque

[11] Patent Number: 4,475,170
[45] Date of Patent: Oct. 2, 1984

[54] PROGRAMMABLE TRANSVERSAL FILTER

[75] Inventor: Yusuf A. Haque, San Jose, Calif.

[73] Assignee: American Microsystems, Inc., Santa Clara, Calif.

[21] Appl. No.: 346,470

[22] Filed: Feb. 8, 1982

Related U.S. Application Data

[63] Continuation-in-part of Ser. No. 316,183, Oct. 29, 1981.

[51] Int. Cl.³ .............................................. G06G 7/02
[52] U.S. Cl. .................................... 364/825; 364/606; 364/824
[58] Field of Search ............... 364/606, 602, 607, 825, 364/824, 844, 862, 724; 333/165

[56] References Cited

U.S. PATENT DOCUMENTS

| | | | |
|---|---|---|---|
| 3,987,293 | 10/1976 | Crooke et al. | 364/825 |
| 4,012,627 | 3/1977 | Antoniak | 364/607 |
| 4,034,199 | 7/1977 | Lampe et al. | 364/862 |
| 4,063,200 | 12/1977 | Mattern | 364/602 |
| 4,120,035 | 10/1978 | Cases et al. | 364/825 |
| 4,218,752 | 8/1980 | Hewes et al. | 364/825 |
| 4,264,983 | 4/1981 | Miller | 364/825 |
| 4,316,258 | 2/1982 | Berger | 364/602 |
| 4,364,116 | 12/1982 | Nossek | 364/825 |

OTHER PUBLICATIONS

"High Accuracy, Low Glitch Sample-and-Hold Circuit," Clement, Ho, Woodword, IBM Technical Disclosure Bulletin, vol. 22, No. 12, 5-80.
"MOS Sampled Data High-Pass Filters Using Switched Capacitor Integrators," Gregorian, Nicholson, Microelectronics Journal, vol. 11, No. 2, 1980, pp. 22-25.
"Analog Current Switch Makes Gain-Programmable Amplifier," Maxwell, Electronics, vol. 50, No. 4, pp. 99, 101, 2-17-77.

Primary Examiner—Jerry Smith
Assistant Examiner—John R. Lastova
Attorney, Agent, or Firm—Steven F. Caserza; Alan H. MacPherson

[57] ABSTRACT

A programmable transversal filter utilizes a plurality of programmable multiplying means. The result of each multiplication is summed by a summing circuit, thus providing an output signal. The delay network comprises a plurality of signal sample and hold circuits which are selectively connected to the input bus in sequence, in order that one sample and hold circuit may store an analog signal sampled during the present time instant, with other sample and hold circuits storing a plurality of analog signals each of which has been sampled during a corresponding one of a plurality of preceding sample periods. The filter also includes a plurality of reference sample and hold circuits which store error voltages equal to the error voltage component of the voltages provided by the signal sample and hold circuits.

A first analog cross-point switch is utilized wherein each of said plurality of time delayed analog signals may be selectively applied to a selected multiplying means. The filter tap weights remain fixed in the multipliers until reprogrammed, without the need for rotating the tap weights.

A second analog cross-point switch is utilized to selectively connect the output voltage from the reference sample and hold circuits to the multiplier means, thereby eliminating the effect of the error voltages on the output voltage of the transversal filter.

6 Claims, 7 Drawing Figures

PROGRAMMABLE TRANSVERSAL FILTER

RELATED APPLICATIONS

This application is a continuation-in-part of Ser. No. 316,183 filed Oct. 29, 1981.

BACKGROUND OF THE INVENTION

1. Field of the Invention

This invention relates to electronic circuits and, more particularly, to a transversal filter having programmable tap weights.

2. Description of the Prior Art

FIG. 1 shows a block diagram of a transversal filter. An analog input signal X(t) to be filtered is applied to terminal 11-0. This input signal X(t) is multiplied by tap weight $a_0$, and the result of this multiplication is input to summation means 21. The input signal X(t) is also applied to delay means $T_1$, thus providing at time t an output signal X(t−1) on node 11-1. This analog signal X(t−1) is multiplied by tap weight multiplier $a_1$, and the result is applied to summing means 21. The analog signal X(t−1) available on node 11-1 is also applied to delay means $T_2$, thus providing at time t an analog signal X(t−2) on node 11-2. This analog signal X(t−2) is multiplied by tap weight multiplier $a_2$ and the result is applied to summing means 21. In a similar manner, a plurality of N delay means $T_1$ through $T_N$ (where N is selected positive integer) are connected as shown in FIG. 1, with the output signal from each delay means being defined as:

$$V_j(t) = X(t-j) \quad (1)$$

where $V_j(t)$ = the output signal from the jth delay means at time t, where $0 \leq j \leq N$; and X(t−j) = the input signal applied to input terminal 11-0 at time (t−j).

The output signals from each of the N delay means $T_1$ through $T_N$ are multiplied by tap weights $a_1$ through $a_N$, respectively, and the non-delayed input signal X(t) is multiplied by tap weight $a_0$. In this manner, the output signal y(t) on output terminal 12 of summing means 21 is equal to:

$$y(t) = \sum_{j=0}^{N} a_j X(t-j) \quad (2)$$

One such prior art transversal filter is described by Puckette, et al in "Bucket-Brigade Transveral Filters", IEEE Transactions on Communication, Volume COM-22, No. 7, July 1974, pages 926–934. Puckette, et al describe the use of a bucket brigade delay line in a transversal filter. The Puckette approach taps the delay line with source followers, the desired weighting being established by the appropriate choice of capacitance values within each source follower.

Transversal filters have also been implemented utilizing charge-coupled devices (CCDs). Such a CCD transversal filter is described by Brodersen, et al, "A 500-Stage CCD Transversal Filter for Spectral Analysis", IEEE Journal of Solid-State Circuits, Volume SC-11, No. 1, February 1976, pages 75–83. Broderson, et al, show that the tap weights are established by the use of appropriate photomasks for forming the electrical interconnects on the device surface. Another prior art CCD transversal filter is described by Baertsch, et al, "The Desired Operation of Practical Charge-Transfer Trasversal Filters", IEEE Journal of Solid-State Circuits, Volume SC—11, No. 1, February 1976, pages 65–73.

The above-mentioned prior art transversal filters are not programmable in that the tap weight multipliers, once established, may not be altered to provide a different transversal filter characteristic. Attempts have been made to provide a programmable transversal filter. Once such attempt is described by White, et al, "CCD and MNOS Devices for Programmable Analog Signal Processing and Digital Non-Volatile Memory", IEEE IEDM, Washington, D.C., 1973, pages 130–133. White, et al, utilize a programmable MNOS conductance which is programmed with a train of pulses to adjust the threshold voltage.

Another programmable transversal filter is described by Haque & Copeland, "An Electrically Programmable Transversal Filter", International Electron Devices Meeting, December 1976, pages 27–30. This prior art programmable transversal filter operates by cycling the tap weight coefficients in a digital shift register. However, such a technique results in the generation of fixed pattern noise due to inherent irregularities in the capacitance of the capacitors used to fix the tap weights stored in the digital shift register.

SUMMARY

The programmable transversal filter constructed in accordance with this invention utilizes an analog delay line to provide a plurality of N (where N is a positive integer) time delayed analog input signals. A plurality of N programmable multiplying means are used to multiply each of said time delayed analog signals by a multiplying factor. The result of each multiplication is summed by a summing circuit, thus providing an output signal from the transversal filter of this invention.

In accordance with this invention, the delay network includes a plurality of N signal sample and hold circuits selectively connected to an input bus to which the analog input signal is applied. In one embodiment of this invention, each sample and hold circuit is formed utilizing a storage capacitor and a source follower, thereby requiring less area on a semiconductor device surface (when implemented in integrated circuit form) than prior art sample and hold circuits which utilize operational amplifiers.

The signal sample and hold circuits are selectively connected to the input bus in sequence, in order that one signal sample and hold circuit may store an analog signal sampled during the present time instant, with other signal sample and hold circuits storing a plurality of analog signals each of which has been sampled during a corresponding one of a plurality of (N−1) preceding sample periods.

Of particular importance in the practice of this invention is the use of an analog cross-point switch, wherein each of said plurality of N time delayed analog signals may be selectively applied to a selected multiplying means, thereby providing a desired multiplied analog signal for application to the summing means, in order that the desired filter function may be realized. By utilizing an analog cross-point switch, a transversal filter having programmable tap weights is constructed wherein the tap weights remain fixed in the multipliers until reprogrammed, without the need for rotating the tap weights among the plurality of multipliers. Because the transversal filter of this invention does not cycle the tap weights among multipliers, the dynamic range of the output signal of the transversal filter constructed in accordance with this invention is increased over prior art programmable transversal filters, with a substantial decrease in fixed pattern noise. This is achieved by not rotating the tap weights through all multipliers. Rotation of tap weights causes noise, as is described in "Distortion in Rotating Tap Weight Transversal Filters", IEEE Journal of Solid State Circuits, Vol. SC-14, June 1979, pp. 627.

In another embodiment of this invention, an additional set of N reference sample and hold circuits are provided, each one of said N reference sample and hold circuits being associated with a corresponding one of the N signal sample and hold circuits. Immediately after each sampling of the input signal by a signal sample and hold circuit, the corresponding reference sample and hold circuit samples a reference voltage. Because each signal sample and hold circuit is closely matched to its associated reference sample and hold circuit, the voltage error of the output voltage provided by the signal sample and hold circuit is equal to the voltage error of the output voltage of its associated reference sample and hold circuit. Two analog cross point switches are utilized, one analog cross point switch to selectively apply the output signals from the signal sample and hold circuits to selected multiplying means, and the second analog cross point switch for selectively applying the output signals from the reference sample and hold circuits to the same multiplying means to which the signal from its associated signal sample and hold circuit is applied. Each multiplying means then utilizes the signal from a reference sample and hold circuit to cancel the error component of the signal applied to the multiplier from the associated signal sample and hold circuit. In this manner, the effect on the output voltage of inaccuracies of the sample and hold circuits is eliminated. Furthermore, the effect on the output voltage due to power supply noise, which may be appreciable when utilizing source follower circuits (which inherently have poor power supply noise rejection) is also eliminated.

A BRIEF DESCRIPTION OF THE DRAWINGS

DETAILED DESCRIPTION

Figure 2:
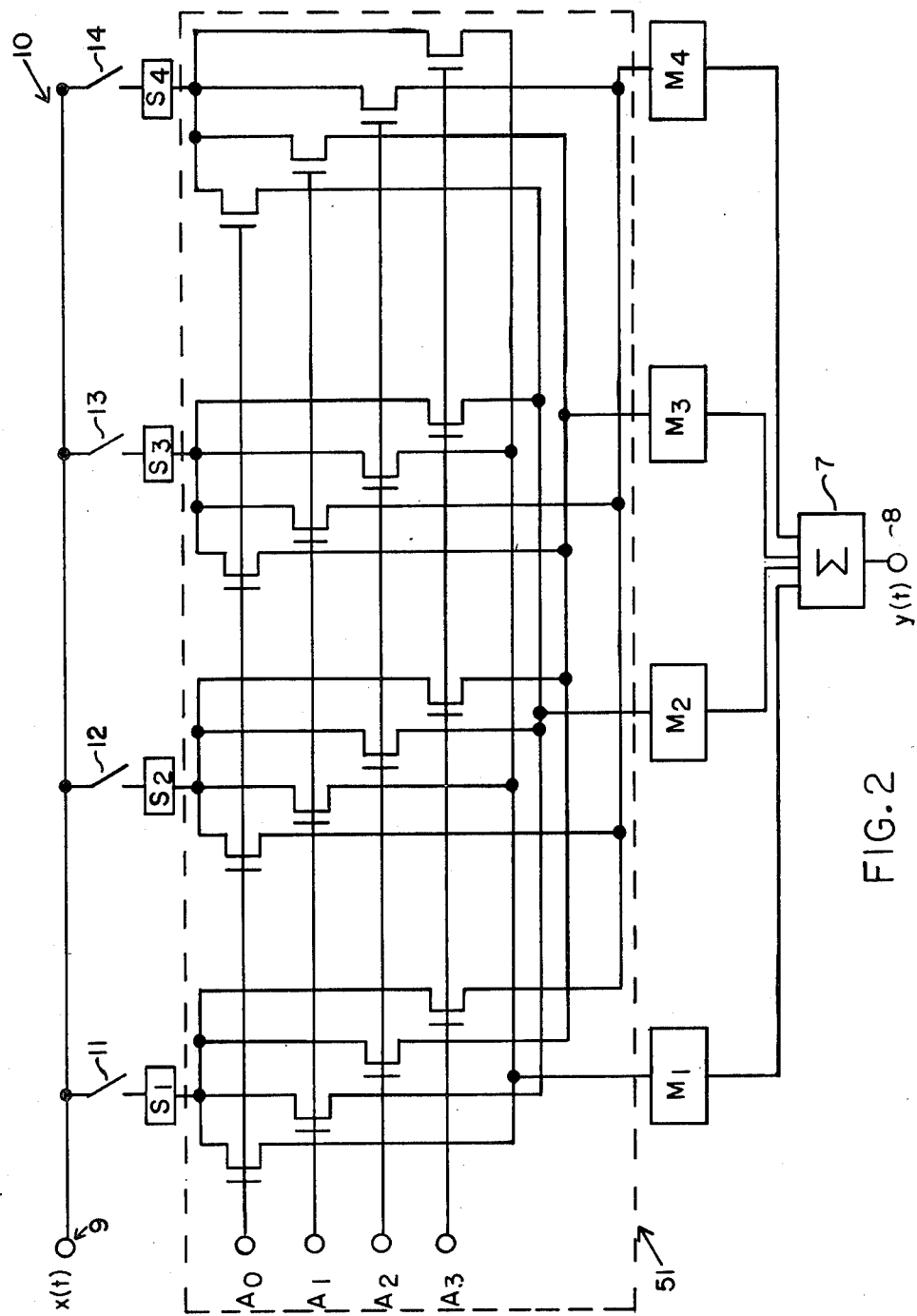
FIG. 2 is a shcematic diagram of one embodiment of the transversal filter constructed in accordance with this invention.

FIG. 2 shows a schematic diagram of one embodiment of a four stage transversal filter 10 constructed in accordance with this invention. In practice, the programmable transversal filters constructed in accordance with this invention will have a large number of stages, typically several tens, although the following discussion regarding the four stage filter of FIG. 2 will describe the operation of this invention.

An analog input signal $X(t)$ is applied to input terminal 9 of transversal filter 10. Switches 11, 12, 13 and 14 selectively connect the input signal $X(t)$ to one of the sample and hold circuits $S_1$ through $S_4$. The operation of switches 11 via 14 is timed to cause the switches 11 through 14 to operate in sequence, such that at time $t_1$, $X(t_1)$ is stored through closed switch 11 in sample and hold circuit $S_1$, at time $t_2$, analog signal $X(t_2)$ is stored via closed switch 12 in sample and hold circuit $S_2$, at time $t_3$ signal $X(t_3)$ is stored via closed switch 13 in sample and hold circuit $S_3$, and at time $t_4$ signal $X(t_4)$ is stored via closed switch 14 in sample and hold circuit $S_4$. In this manner, at any time $t$, analog signal $X(t)$, $X(t-1)$, $X(t-2)$, and $X(t-3)$ will be stored in sample and hold circuits $S_1$ through $S_4$, although the location of signal $X(t)$ and the time delayed signals $X(t-1)$, $X(t-2)$ and $X(t-3)$ within sample and hold circuits $S_1$ through $S_4$ will vary with time. This is depicted in Table I.

The operation of the programmable transversal filter 10 of FIG. 2 is as follows, and will be easily understood in conjunction with Table I. First, the tap weights (i.e., multiplying factors) are loaded into multiplying means $M_1$ through $M_4$ (having tap weights of $a_1$ through $a_4$, respectively) in a well-known manner which will be more fully described later. Then, at time $t_1$, switch 11 closes and switches 12, 13 and 14 are open, thus storing $X(t_1)$ in sample and hold circuit $S_1$. At time $t_2$, switch 12 closes and switches 11, 13 and 14 are open, thus storing $X(t_2)$ in sample and hold circuit $S_2$. At time $t_3$, switch 13 closes and switches 11, 12 and 14 are open, thus storing $X(t_3)$ in sample and hold circuit $S_3$. Similarly at time $t_4$, switch 14 closes and switches 11, 12 and 13 open, thus storing $X(t_4)$ in sample and hold circuit $S_4$. At time $t_5$, switch 11 closes and $X(t_5)$ is stored in sample and hold circuit $S_1$, with the original signal $X(t_1)$ stored in sample and hold circuit $S_1$ being lost. Another way of looking at this storage technique is that at time $t_5$, sample and hold circuit $S_1$ stores $X(t_5)$, sample and hold circuit $S_4$ has stored $X(t_4)$, sample and hold circuit $S_3$ has stored $X(t_3)$, and sample and hold circuit $S_2$ has stored $X(t_2)$.

The operation of cross-point switch 51 is depicted in FIG. 2. The switches shown in analog cross-point switch 51 are shown as N channel metal oxide silicon (MOS) transistors, although any suitable switch means may be used. Utilizing N channel transistors, a high voltage (logical one) applied to the gate of the transistor causes it to conduct, while a low voltage (logical zero) applied to the gate causes it to turn off. A single logical one is applied to terminals $A_0$ through $A_3$ at any one time.

As shown in Table I, at time $t_1$ with a logical one applied to terminal $A_0$, and logical zeroes applies to terminals $A_1$ through $A_3$, sample and hold circuit $S_1$ is connected to multiplier $M_1$, sample and hold circuit $S_2$ is connected to multiplier $M_4$, sample and hold circuit $S_3$ is connected to multiplier $M_3$, and sample hold circuit $S_4$ is connected to multiplier $M_2$.

At time $t_2$, a logical one is applied to terminal $A_1$, with terminals $A_0$, $A_2$ and $A_3$ being held low (logical zero). Thus, sample and hold circuit $S_2$ is connected to multiplier $M_1$, sample and hold circuit $S_3$ is connected to multiplier $M_4$, sample and hold circuit $S_4$ is connected to multiplier $M_3$, and sample and hold circuit $S_1$ is connected to multiplier $M_2$. the address signals applied to terminals $A_0$ through $A_3$, and the resultant connections between sample and hold circuits $S_1$ through $S_4$ to multipliers $M_1$ through $M_4$, are shown in Table I for times $t_1$ through $t_4$.

Thus, as shown in Table I, the output voltage from multiplier $M_1$ during each time $t_1$ through $t_4$ is equal to $a_1X(t)$; the output voltage from multiplier $M_2$ is equal to $a_2X(t-1)$; the output voltage from multiplier $M_3$ is equal to $a_3X(t-2)$; and the output voltage from multiplier $M_4$ is equal to $a_4X(t-3)$. Thus, as shown in Table I, at all times $t_1$ through $t_4$ the output voltage $y(t)$ from summing means 7 available on terminal 8 is equal to $$y(t) = a_1X(t) + a_2X(t-1) + a_3X(t-2) + a_4X(t-3) \qquad (3)$$

which is the output voltage desired from a transversal filter.

Figure 1:
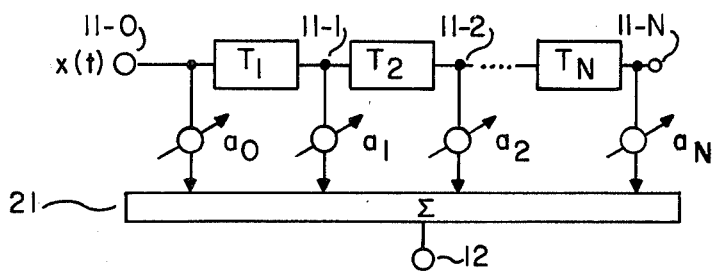
FIG. 1 is a block diagram of a typical transversal filter.
Figure 3:
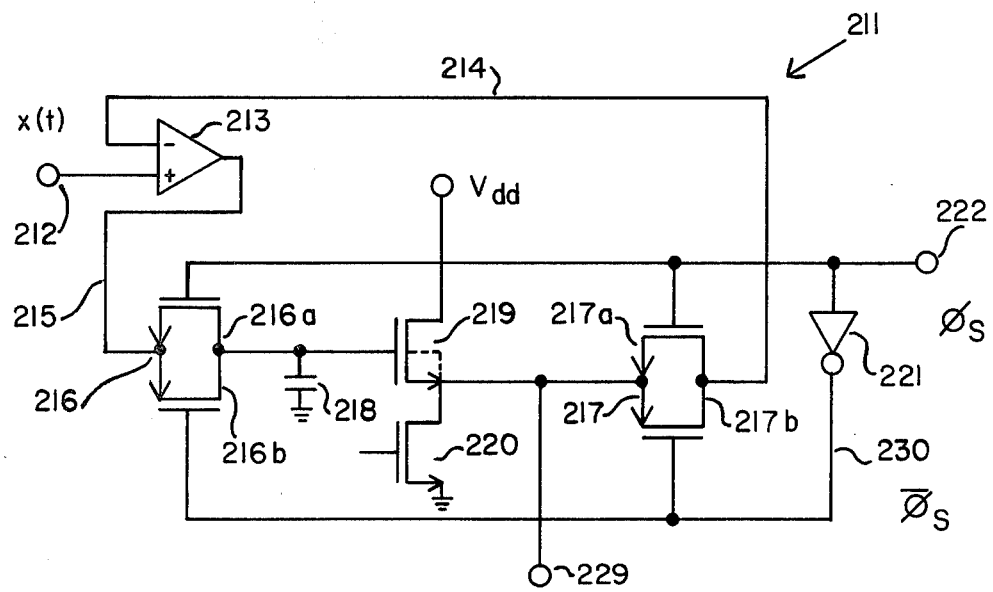
FIG. 3 is a schematic diagram of a sample and hold circuit utilized in the circuit shown in FIG. 2.

One sample and hold circuit which may be used for sample and hold circuits $S_1$ through $S_4$ of FIG. 2 is shown in the schematic diagram of FIG. 3. Sample and hold circuit 211 comprises input terminal 212 which is connected to the input voltage $X(t)$ through switch 11 of FIG. 2, when sample and hold circuit 211 serves as sample and hold circuit $S_1$ (FIG. 2). Input terminal 212 of sample and hold circuit 211 is connected to the noninverting input lead of operational amplifier 213. The output lead 215 of operational amplifier 213 is connected to transmission gate 216 comprising N channel MOSFET 216a and P channel MOSFET 216b. The state of transmission gate 216 (i.e., conducting or nonconducting) is controlled by sample and hold signal $\phi_s$ connected to terminal 222. Sample and hold signal $\phi_s$ is connected to the gate of N channel MOSFET 216a, and to inverter 221. Inverter 221 generates on its output lead 230 an inverted sample and hold signal $\overline{\phi_s}$ which is connected to the gate of P channel MOSFET 216b. Thus, with high (positive) $\phi_s$ connected to terminal 222, transmission gate 216 conducts, and with a low $\phi_s$ transmission gate 216 turns off. In a similar manner, a second transmission gate 217 comprising N channel MOSFET 217a and P channel MOSFET 217b is controlled by sample and hold signal 100 $_s$.

During the sample phase, $\phi_s$ goes high, and transmission gates 216 and 217 conduct. The output voltage from operational amplifier 213 is connected through transmission gate 216 to capacitor 218, thus charging capacitor 218 to the output voltage $V_x$ of operational amplifier 213. This output voltage provides gate bias to N channel MOSFET 219, thus causing transistor 219 to turn on, thus providing a voltage $V_{out}$ on output terminal 229. This voltage $V_{out}$ is also applied through transmission gate 217 to inverting input lead 214 of operational amplifier 213. Because the steady state voltages on the inverting input lead and the noninverting input lead of an operational amplifier are equal, the voltage $V_{out}$ is equal to the input voltage $V_{in}$. In this manner, the output voltage $V_x$ generated on output lead 215 of operational amplifier 213 and stored on capacitor 218 has a magnitude sufficient to bias the gate of transistor 229 in such a fashion as to generate on output terminal 229 a voltage $V_{out}$ which is exactly equal to the sample input voltage $V_{in}$.

After a time period of approximately 3 microseconds required to achieve a steady state condition in sample and hold circuit 211 such that the output voltage $V_{out}$ on output terminal 219 is exactly equal to the sampled input voltage $V_{in}$, the sample signal $\phi_s$ goes low, thus turning off transmission gates 216 and 217. Thus, a voltage $V_x$ is stored on capacitor 218, which continues to bias the gate of transistor 219 so as to provide an output voltage $V_{out}$ on output terminal 229 which is exactly equal to the sampled input voltage $V_{in}$. Because transistor 219 is a metal oxide silicon (MOS) device, the gate bias provided by capacitor 218 requires virtually no current to be drawn from capacitor 218, thereby preventing the discharge of the voltage $V_x$ stored on capacitor 218. Thus, the voltage $V_x$ stored on capacitor 218 may be used to generate on output terminal 229 a voltage $V_{out}$ equal to sampled input voltage $V_{in}$ for long periods of time of the order of several milliseconds. The output voltage $V_{out}$ provided on output terminal 229 is not affected by the turning off of transmission gate 217 because the very high impedance of inverting input lead 214 of operational amplifier 213 draws substantially no current from output terminal 229.

When it becomes necessary to sample and store a second input signal $V_{in}'$, sample and hold signal $\phi_s$ goes high, thus turning on transmission gates 216 and 217. A new voltage $V_x'$ is thus stored on capacitor 218, thereby generating a new voltage $V_{out}$ equal to $V_{in}'$ on output terminal 229.

Figure 4:
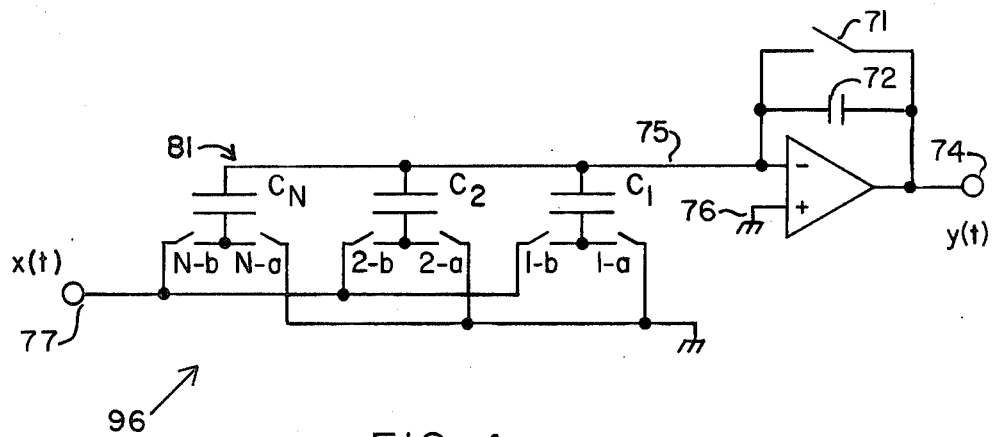
FIG. 4 is a schematic diagram of the multiplying means utilized in the transversal filter shown in FIG. 2.

One multiplying means which may be used for each multiplier $M_1$ through $M_4$ (FIG. 2) is shown in schematic diagram in FIG. 4. Multiplier 96 includes operational amplifier 73 having output terminal 74, noninverting input lead 76 connected to ground, and inverting input lead 75. Integrating capacitor 72, having a capacitance value $C_{72}$, is connected between inverting lead 75 and output terminal 74. Connected in parallel with capacitor 72 is switch 71, which serves to discharge capacitor 72. Capacitor array 81, comprising a plurality of N capacitors $C_1$ through $C_N$, is also utilized in the multiplier 96. One plate of each capacitor $C_1$ through $C_N$ is connected to the inverting input lead 75 of operational amplifier 73. The second plate of each capacitor $C_1$ through $C_N$ is connected to a pair of switches 1-a through N-a, and 1-b through N-b. The other terminal of switches 1-a through N-a is connected to ground, thus allowing the second plate of capacitors $C_1$ through $C_N$ to be selectively connected to ground. Similarly, the other terminal of switches 1-b through N-b is connected to input terminal 77 in order that the second plate of each capacitor $C_1$ through $C_N$ may be selectively connected to the analog input voltage $V_{in}$ to be multiplied by multiplier 96. Capacitors $C_1$ through $C_N$ may be of equal value, such that the effective capacitance of capacitor array 81 may range between 0 and NC, where N is the number of capacitors in capacitor array 81, and C is the capacitance value of each of the N capacitors. Alternatively, the capacitors $C_1$ through $C_N$ of capacitor array 81 may be binary weighted, such that the capacitance value of each capacitor is defined as:

$$C_j = 2^{(j-1)} C \qquad (4)$$

where
  $C_j$ = the capacitance value of the jth capacitor,
  j is a positive integer such that $0 \leq j \leq N$; and
  $C_1$ is the capacitance value of capacitor $C_1$.

In this manner, by selectively operating switches 1-a through N-a and 1-b through N-b, the effective capacitance of capacitor array 81 is equal to $$C_{81} = FC; \qquad (5)$$

where $C_{81}$ is the effective capacitance of capacitor array 81; and

F is an integer such that $0 \leq F \leq (2^N - 1)$, where N is the number of capacitors in capacitor array 81.

The operation of multiplier 96 of FIG. 4 is as follows. If the sign bit of the digital tap weight multiplying factor indicates that the tap weight is positive, switch 71 closes, thus discharging capacitor 72. Switches 1-a through N-a also close, thus discharging capacitors $C_1$ through $C_N$. Switch 71 then opens. Selected ones of switches 1-b through N-b then close, with the corresponding switches 1-a through N-a opening. Thus, if switches 3-b and 7-b close, switches 3-a and 7-a open. The selection of which of switches 1-b through N-b will close is made such that the ratio of the effective capacitance of capacitor array 81 to the capacitance of capacitor 72 is equal to the desired multiplication factor, or tap weight. Thus, $$G_{76} = -\frac{C_{81}}{C_{72}} \qquad (6)$$

where $G_{76}$=the closed loop gain of operational amplifier 76, and thus equal to the tap weight of multiplier 96.

The closing of selected switches 1-b through N-b charges the selected capacitors $C_1$ through $C_N$ to a voltage equal to $V_{in}$, thus integrating a charge equal to $C_{81}V_{in}$ on integration capacitor 72. This results in an output voltage $V_{out}$ on terminal 74 equal to $$V_{out} = -G_{76}V_{in}. \qquad (7)$$

On the other hand, if the sign bit of the digital tap weight multiplying factor indicates that the tap weight is negative, switch 71 closes, thus discharging capacitor 72. Switches 1-b through N-b then close, thus charging capacitors $C_1$ through $C_n$ to $V_{in}$. Switch 71 then opens. Selected ones of switches 1-a through N-a then close, with the corresponding switches 1-b through N-b opening. Thus, if switches 3-a and 7-a close, switches 3-b and 7-b open.

The closing of selected switches 1-a through N-a discharges the selected capacitors $C_1$ through $C_N$, thus integrating a charge equal to $-C_{81}V_{in}$ on integration capacitor 72. This results in an output voltage $V_{out}$ on terminal 74 equal to $$V_{out} = G_{76}V_{in} \qquad (8)$$

Thus, multiple 96 is capable of multiplying an analog input signal with a digital tap weight. The analog input signal and the digital tap weight may be either positive or negative.

Figures 5, 7:
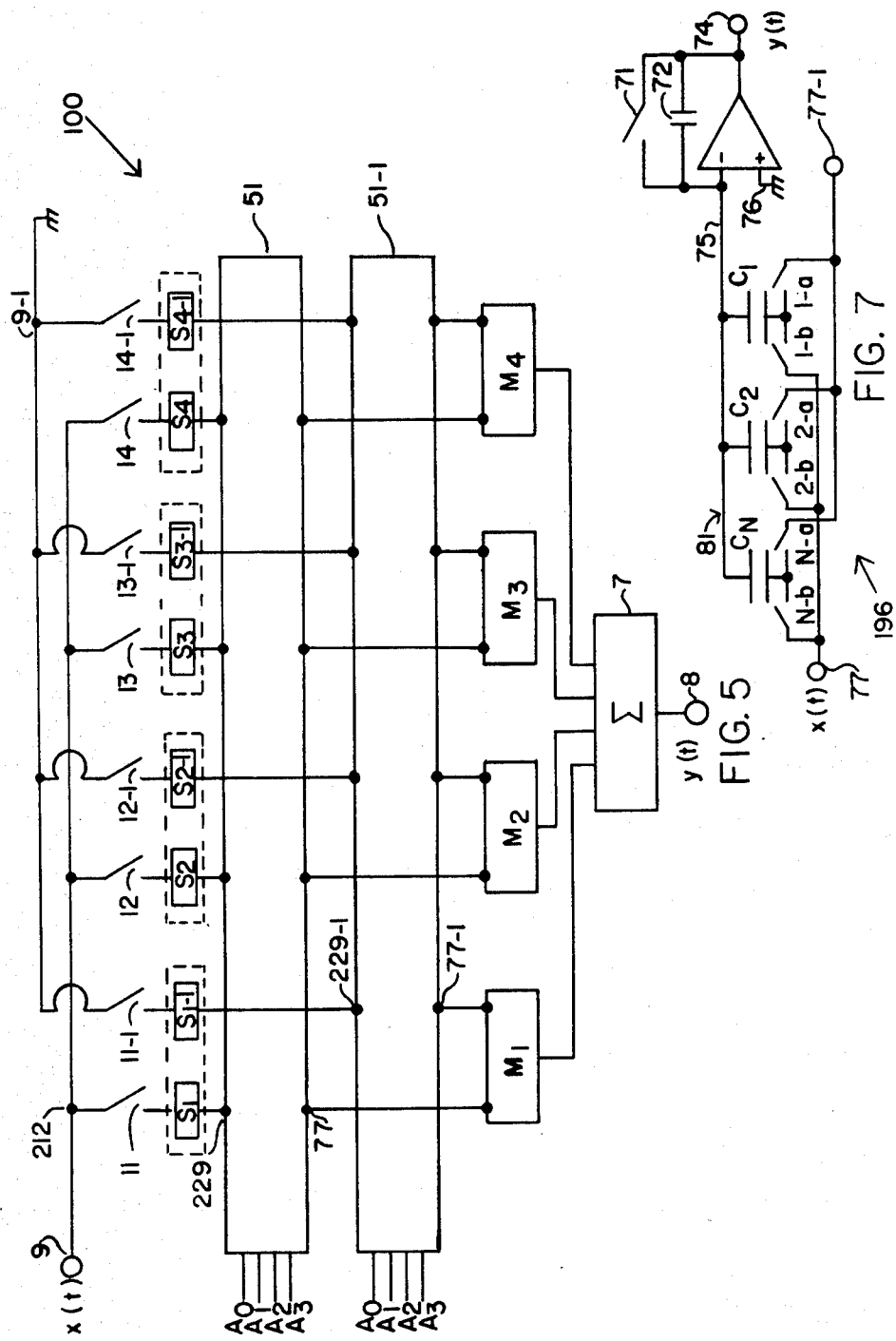
FIG. 5 is a schematic diagram of another embodiment of the transversal filter constructed in accordance with this invention.
FIG. 7 is a schematic diagram of the multiplying means utilized in the transversal filter shown in FIG. 5.

Another embodiment of this invention is shown in the block diagram of FIG. 5. The embodiment of FIG. 5 is similar to the embodiment of FIG. 2, and thus similar reference numerals are used to describe similar devices within the two embodiments. The embodiment of FIG. 5 includes signal sample and hold circuits $S_1$, $S_2$, $S_3$ and $S_4$ as in the embodiment of FIG. 2, and also includes reference sample and hold circuits $S_1$-1, $S_2$-1, $S_3$-1 and $S_4$-1. Signal sample and hold circuits $S_1$ through $S_4$ have their input leads connected to terminal 9 through switches 11, 12, 13 and 14, respectively. Terminal 9 receives the input signal X(t), and thus sample and hold circuits $S_1$ through $S_4$ are referred to as signal sample and hold circuits. Conversely, sample and hold circuits $S_1$-1 through $S_4$-1 have their input leads connected to bus 9-1 which is connected to a reference potential (in this case, the reference potential is ground). Accordingly, sample and hold circuits $S_1$-1 through $S_4$-1 are referred to as reference sample and hold circuits. Signal sample and hold circuit $S_1$ is physically and structurally related to reference sample and hold circuit $S_1$-1, thus sample and hold circuits $S_1$ and $S_1$-1 are shown within a dashed line rectangle in FIG. 5. Similarly, sample and hold circuits $S_2$ and $S_2$-1, sample and hold circuits $S_3$ and $S_3$-1, and sample and hold circuits S and $S_4$-1 are physically and structurally related and shown within dashed line rectangles in FIG. 5.

The embodiment of FIG. 5 also includes cross point switch array 51, which connects the output leads from signal sample and hold circuits $S_1$ through $S_4$ to multiplier means $M_1$ through $M_4$ in sequence, as has been previously described for the embodiment of FIG. 2. The embodiment of FIG. 5 also includes analog cross point switch 51-1 which is identical in structure to analog cross point switch 51. Analog cross point switch 51-1, however, selectively connects the output leads of reference sample and hold circuits $S_1$-1 through $S_4$-1 to multiplier means $M_1$ through $M_4$ in identical fashion as analog cross points switch 51 connects the output leads of signal sample and hold circuits $S_1$ through $S_4$ to multiplier means $M_1$ through $M_4$. Thus, the related sample and hold circuits are connected to the same multiplier means. For example, when signal sample and hold circuit $S_1$ is connected to multiplier means $M_1$ by the operation of analog cross point switch 51, reference sample and hold circuit $S_1$-1 is also connected to multiplier means $M_1$ through the operation of analog cross point switch 51-1.

In the embodiment of FIG. 2, signal sample and hold circuits $S_1$ through $S_4$ sequentially sample the input voltage X(t) on terminal 9. In the embodiment of this invention shown in FIG. 5, immediately after (or alternatively, immediately before) a signal sample and hold circuit $S_1$ through $S_4$ samples the input voltage X(t) applied to terminal 9, the related reference sample and hold circuit $S_1$-1 through $S_4$-1, respectively, samples and holds the reference voltage available on bus 9-1. Because each signal sample and hold circuit and its associated reference sample and hold circuit are closely matched, and in fact share some of the same components and, when implemented as an integrated circuit device, are located in close physical proximity to each other within the integrated circuit device, the associated signal sample and hold circuit and reference sample and hold circuit will both be susceptible to voltage errors of substantially equal magnitude. Thus, if signal sample and hold circuit $S_1$ provides an output voltage $X(t) - V_{error}$ in response to input signal X(t), reference sample and hold circuit $S_1$-1 will provide an output voltage $-V_{error}$ in response to an input signal of zero (ground). Thus, by applying the output voltage from each signal sample and hold circuit as well as the output voltage from its associated reference sample and hold circuit to a single multiplier means $M_1$ through $M_4$, the error voltage $V_{error}$ may be eliminated, thus providing an output voltage y(t) from summation means 7 which is free from effects of voltage errors caused by sample and hold circuits $S_1$ through $S_4$.

Figure 6:
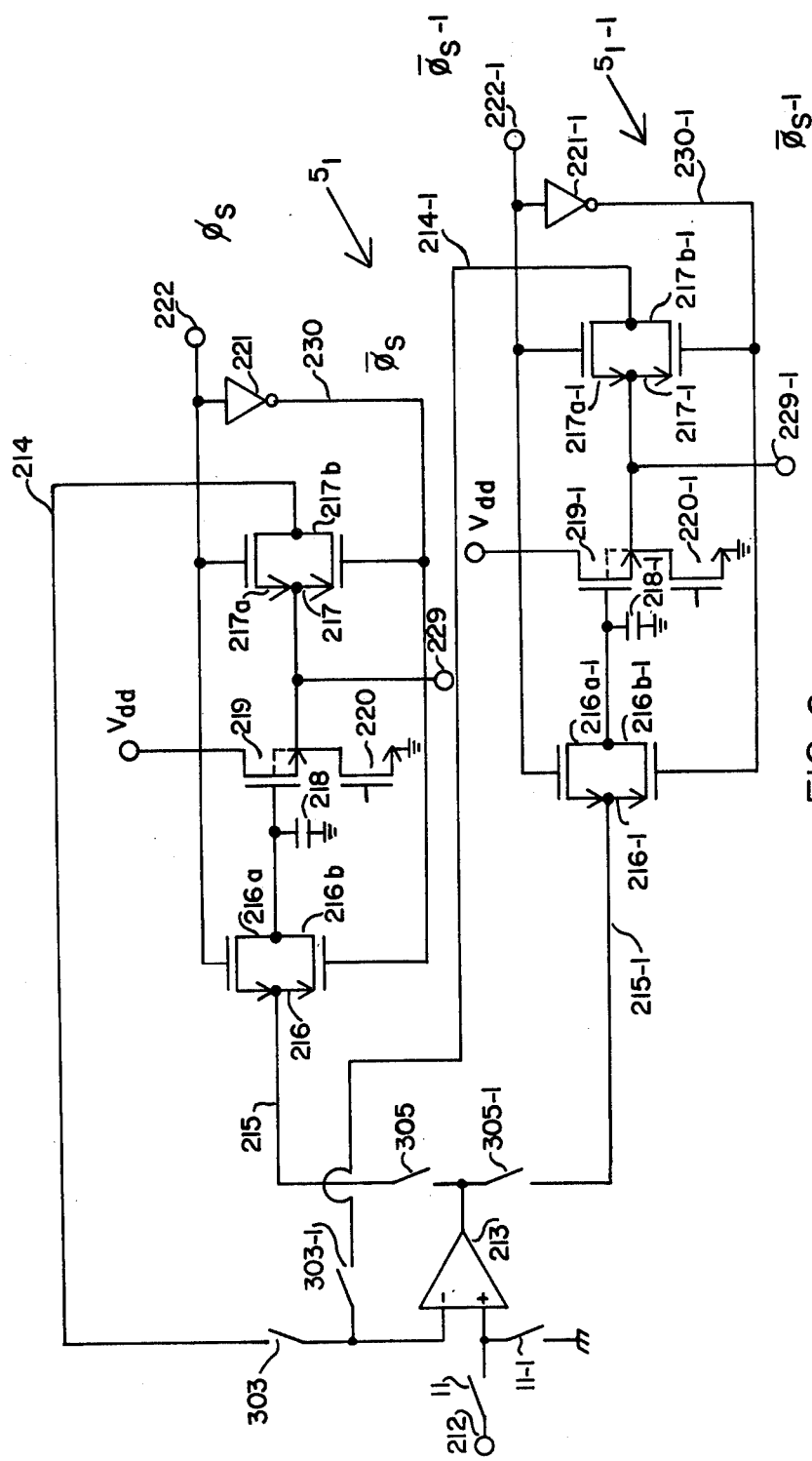
FIG. 6 is a schematic diagram of one set of sample and hold circuits utilized in the circuit shown in FIG. 5.

FIG. 6 shows a schematic diagram of one embodiment of a signal sample and hold circuit $S_1$ and its associated reference sample and hold circuit $S_1$-1. It is to be understood that sample and hold circuits identical to the sample and hold circuits shown in FIG. 6 are used to form each pair of sample and hold circuits $S_1$, $S_1$-1 and $S_2$, $S_2$-1, and $S_3$, $S_3$-1, and $S_4$, $S_4$-1.

When the input voltage X(t) is to be sampled by the signal sample and hold circuit $S_1$, signal $\phi_s$ goes high, thus closing switches 11, 303, and 305 and turning on MOSFET transmission gates 216 and 217. Signal $\phi_s$-1 is low at this time, thus maintaining switches 11-1, 303-1 and 305-1 open and MOSFET transmission gates 216-1 and 217-1 off. In this manner, the input voltage X(t) applied on node 212 is connected to the noninverting input lead of operational amplifier 213. The output lead of operational amplifier 213 is connected through switch 305 to the input lead 215 of sample and hold circuit $S_1$. The inverting input lead of operational amplifier 213 is connected through switch 303 to lead 214 of sample and hold circuit $S_1$. In this fashion, as previously described in connection with the sample and hold circuit shown in the schematic diagram of FIG. 3, a voltage is stored on capacitor 218 which causes transistors 219 and 220 to provide a voltage on terminal 229 which is equal to the input voltage X(t) being sampled. Signal $\phi_s$ then goes low, thus causing switches 11, 303, and 305 to open, and MOSFET transmission gates 216 and 217 to turn off, thus storing the voltage on capacitor 218 which provides a voltage on terminal 229 equal to the sample input voltage X(t). Immediately after this sampling of the input voltage, a reference voltage is sampled by reference sample and hold circuit $S_1$-1. During this time, signal $\phi_s$-1 goes high, thus causing switches 11-1, 303-1 and 305-1 to close and MOSFET transmission gates 216-1 and 217-1 to turn on, thus connecting the non-inverting input lead of operational amplifier 213 to ground, the output lead of operational amplifier 213 to input lead 215-1 of sample and hold circuit $S_1$-1, and the inverting input lead of operational amplifier 213 to lead 214-1 of sample and hold circuit 214-1. In this manner, as previously described in conjunction with the sample and hold circuit of FIG. 3, a voltage is stored on capacitor 218-1 which causes a voltage to be generated on terminal 229-1 which is equal to the sampled input voltage, ground in this case.

However, due to inaccuracies due to parasitic capacitive coupling, leakage, and power supply noise, the voltage available on terminal 229 will not be equal to X(t), but rather will be equal to X(t)−$V_{error}$, where $V_{error}$ is the error component of the voltage available on terminal 229. The components of this error voltage $V_{error}$ due to parasitic capacitive coupling and leakage result in fixed pattern noise in the output signal y(t). The component of the error voltage $V_{error}$ due to non-repetitious power supply noise causes random noise in the output signal y(t). For capacitors 218 and 218-1 of approximately 5pf and input voltages X(t) within the range of ±3.5 volts, $V_{error}$ is on the order of millivolts. Similarly, the output voltage available on terminal 229-1 will not be equal to zero, but will be equal to −$V_{error}$. As previously described, each device within sample and hold circuit $S_1$-1 is closely matched to its corresponding component within sample and hold circuit $S_1$. Furthermore, when the sample and hold circuits are implemented as a monolithic integrated circuit device, sample and hold circuits $S_1$ and $S_1$-1 are physically in close proximity, thereby providing a close match. Accordingly, the error voltages available on terminals 229 and 229-1 will be substantially equal. As shown in the diagram for FIG. 5, the output terminal 229 of sample and hold circuit $S_1$ is connected to one input lead of analog cross-point switch 51 and similarly output terminal 229-1 of reference sample and hold circuit $S_1$-1 is connected to one input lead of analog cross-point switch 51-1.

A schematic diagram of one multiplier means which may be used in conjunction with this invention is shown in FIG. 7. The multiplier means 196 is similar to the multiplier means 96 of FIG. 4, and accordingly similar devices within multiplier means 96 and 196 have similar reference numerals. However, rather than having the common side of switches 1-a, 2-a, through N-a, connected to ground as in the embodiment of FIG. 4, the multiplier means of FIG. 7 provides a terminal 77-1 which is connected in common to one side of switches 1-a, 2-a through N-a. This terminal 77-1 is connected to one output lead of cross-point switch 51-1. As in the embodiment of FIG. 4, terminal 77 is connected to one output lead of analog cross-point switch 51. Of importance, the operation of analog cross-point switches 51 and 51-1 are synchronized such that any given signal sample and hold circuit and its associated reference sample and hold circuit are both connected to the same multiplier means. Thus, when signal sample and hold circuit $S_1$ is connected through analog cross-point switch 51 to terminal 77 of multiplier means $M_1$, its associated reference sample and hold circuit $S_1$-1 is connected through analog cross-point switch 51-1 to terminal 77-1 of multiplier means $M_1$. The gain of multiplier 196 is selected in the same manner as previously described for multiplier 96 of FIG. 4, and thus will not be described again here. Once the gain has been selected, selected switches 1-b through N-b charges the selected capacitors $C_1$ through $C_N$ to a voltage equal to X(t)−$V_{error}$, where X(t) is the voltage sampled by the signal sample and hold circuit whose output is connected to terminal 77 of multiplier 196. This operation provides an output voltage of y(t) on terminal 74 equal to −$G_{76}$ [X(t)-$V_{error}$], where $G_{76}$ is the gain of multiplier 196. The closed switches 1-b through N-b then open, and their corresponding switches 1-a through N-a then close, thus connecting the error voltage −$V_{error}$ available from the reference sample and hold circuit connected to terminal 77-1 of multiplier means 196 to the selected capacitors $C_1$ through $C_N$. this operation integrates the error voltage −$V_{error}$ on integration capacitor 78, resulting in an output voltage $y(t) = -G_{76}[-V_{error}] - [G_{76}[X(t) - V_{error}]]$ or $y(t) = G_{76}X(t)$. Accordingly, the effect on the output voltage y(t) due to the error voltage $V_{error}$ is eliminated, thus eliminating fixed pattern noise and random noise due to power supply noise, thereby increasing the dynamic range of the transversal filter constructed in accordance with this invention as compared to prior art transversal filters. In other words, the transversal filter constructed in accordance with this invention can accurately respond to input signals X(t) of lower magnitude than can prior art transversal filters. Eliminating the effect of power supply noise on the output voltage y(t) is particularly important in circuits which utilize source followers, since source followers have inherently poor power supply noise rejection.

The discussion in this specification is by way of example and is not to be construed as a limitation on the scope of this invention. Many alternate embodiments will become apparent to those skilled in the art in light of this disclosure.

I claim:

1. A programmable tranversal filter comprising:

a first input terminal for receiving an input signal to be filtered;

a second input terminal for receiving a reference voltage;

a plurality of N signal sample and hold means, where N is a selected positive integer, each of said N signal sample and hold means having an output lead and having an input lead for direct connection to said first input terminal;

a first plurality of N reference sample and hold means, each of said N reference sample and hold means having an output lead and an input lead for direct connection to said second input terminal;

a first plurality of N switch means for connecting the input lead of a selected one of said first plurality of signal sample and hold means to said first input terminal such that said selected one of said signal sample and hold means receives said input signal to be filtered;

a second plurality of N switch means for connecting the input lead of a selected one of said first plurality of reference sample and hold means to said second input terminal such that said selected one of said reference sample and hold means receives said reference voltage;

a plurality of N multiplying means, each having a first input lead, a second input lead, and an output lead;

a summing means having a plurality of N input leads and an output lead;

means for connecting the output lead of each said multiplying means to a unique one of said summing means input leads;

a plurality of N×N switch means forming a first cross-point switch allowing said output lead of each said N signal sample and hold means to be uniquely connected to said first input lead of a selected one of said N multiplying means;

a plurality of N×N switch means forming a second cross-point switch allowing the output lead of each said second plurality of N reference sample and hold means to be uniquely connected to said second input lead of a selected one of said N multiplying means;

a signal sample and hold control means for sequentially closing a single one of said first plurality of N switch means, thereby causing to be stored in said N signal sample and hold means sampled input signals from N previous time instants;

a reference sample and hold control means for sequentially closing a single one of said second plurality of N switch means, thereby causing to be stored in said second plurality of N reference sample and hold means sampled reference signals from N previous time instants;

a first cross-point switch control means for operating said first cross-point switch such that each of said first plurality of N sample and hold means is connected to said first input lead of a selected multiplying means;

a second cross-point switch control means for operating said second cross-point switch such that each of said second plurality of N sample and hold means is connected to said second input lead of a selected multiplying means;

whereby said input signal is filtered and the signal error caused by said first plurality of sample and hold means is cancelled, providing a filtered output signal on said output terminal of said summing means.

2. Structure as in claim 1 wherein the output lead of the sample and hold means containing the kth previous signal sample and the output lead of the sample and hold circuit containing the kth previous reference signal sample are connected to the first and the second input leads, respectively, of the kth multiplying means, where $1 \leq k \leq N$.

3. Structure as in claim 1 wherein said output signal is equal to $$y(t) = \sum_{j=0}^{N-1} a_j X(t-j)$$

where y(t)=the output signal at time t;

$a_j$=the multiplication factor of the jth multiplying means; and

X(t−j)=the input signal at time (t−j).

4. Structure as in claims 1, 2 or 3 wherein said switch means are metal oxide silicon (MOS) devices.

5. Structure as in claims 1, 2 or 3 wherein said ith signal sample and hold means and said ith reference sample and hold means (where $1 \leq i \leq N$) comprise:

an operational amplifier having a noninverting input lead for receiving an input signal to be sampled, an inverting input lead, and an output lead;

a first capacitor having a first plate connected to a reference voltage and having a second plate;

a first amplifier means having an input lead connected to said second plate of said first capacitor and also having an output lead;

a first input switch means for connecting said output lead of said operational amplifier to said second plate of said first capacitor during sampling of said input signal;

a first output switch means for connecting said output lead of said amplifier means to said inverting input lead of said operational amplifier during sampling of said input signal;

a second capacitor having a first plate connected to a reference voltage and having a second plate;

a second amplifier means having an input lead connected to said second plate of said second capacitor and also having an output lead;

second input switch means for connecting said output lead of said operational amplifier to said second plate of said second capacitor during sampling of said reference signal;

second output switch means for connecting said output lead of said second amplifier means to said inverting input lead of said operational amplifier during sampling of said reference voltage;

whereby said first capacitor is charged during the sampling of said input signal to a value sufficient to generate on said output lead of said first amplifier means a voltage equal to said input signal during sampling plus an error voltage, and where the charge on said first capacitor, and thus the voltage on said output lead of said first amplifier means, remains substantially constant during periods when said input signal is not sampled by said ith signal sample and hold means, and whereby said second capacitor is charged during sampling of said reference voltage to a value sufficient to generate on said output lead of said second amplifier means a voltage equal to said reference signal during sampling plus an error voltage, and where the charge on said second capacitor, and thus the voltage on said output lead of said second amplifier means, remains substantially constant during periods when said reference voltage is not sampled by said ith reference sample and hold means;

means for controlling said first input switch means and said first output switch means such that said first input and first output switch means are open during sampling of said input signal, and said first input and first output switch means are closed during a holding period; and means for controlling said second input switch means and said second output switch means such that said second input and second output switch means are open during sampling of said reference voltage, and said second input and second output switch means are closed during a holding period.

6. Structure as in claims 1, 2 or 3 wherein each said multiplying means comprises:

a first input terminal for receiving an input signal containing an error voltage;

a second input terminal for receiving reference signal containing an error voltage;

a plurality of P capacitors, each having a first and a second plate;

an operational amplifier having an inverting input lead connected to said first plate of each of said plurality of P capacitors, a noninverting input lead connected to a reference voltage, and an output lead;

an integrating capacitor connected between said inverting input lead and said output lead of said operational amplifier;

a plurality of P switch means, each associated with a unique one of said P capacitors and each allowing the connection of said second plate of its associated one of said P capacitors to either said reference voltage or said input terminal;

means responsive to the magnitude of a multiplying factor for causing selected ones of said P switch means to operate in response to the receipt of said input signal; and means responsive to the sign of a multiplying factor for selectively operating said selected ones of said plurality of P switch means such that said integrating capacitor integrates a charge equal to the positive of said input signal multiplied by the effective capacitance of those of said plurality of P capacitors associated with said selected ones of said P switch means when said sign of said multiplying factor is positive, and equal to the negative of said input signal multiplied by the effective capacitance of those of said plurality of P capacitors associated with said selected ones of said P switch means when said sign of said multiplying factor is negative, thereby providing an output signal on said output lead of said operational amplifier equal to said input signal multiplied by said multiplying factor.

* * * * *

UNITED STATES PATENT AND TRADEMARK OFFICE
CERTIFICATE OF CORRECTION

PATENT NO. : 4,475,170

DATED : October 2, 1984

INVENTOR(S) : Yusuf A. Haque

It is certified that error appears in the above—identified patent and that said Letters Patent is hereby corrected as shown below:

Column 2, line 9: Delete "Once" and insert --One--.

Column 4, line 10: Delete "through" and insert --via--.

Column 4, line 55: Delete "applies" and insert --applied--.

Column 4, line 67: Delete "the" and insert --The--.

Column 10, line 32: Delete "charges" and insert --charge--.

Table I has been omitted and should be added to the patent.

After sheet 4 of 4 of the Drawings, the following Table should be inserted.

Signed and Sealed this

Ninth Day of July 1985

[SEAL]

Attest:

DONALD J. QUIGG

Attesting Officer     Acting Commissioner of Patents and Trademarks

TABLE I

| time | Signal Stored in Sample and Hold Circuits | | | | Address Signals | | | | Multiplier Connected to Sample and Hold Circuits | | | | Output Voltage from Multipliers | | | | Output Voltage y(t) from Summing Means 7 |
|---|---|---|---|---|---|---|---|---|---|---|---|---|---|---|---|---|---|
| | $S_1$ | $S_2$ | $S_3$ | $S_4$ | $A_3$ | $A_2$ | $A_1$ | $A_0$ | $S_1$ | $S_2$ | $S_3$ | $S_4$ | $M_1$ | $M_2$ | $M_3$ | $M_4$ | |
| $T_1$ | $X(t)$ | $X(t-3)$ | $X(t-2)$ | $X(t-1)$ | 0 | 0 | 0 | 1 | $M_1$ | $M_4$ | $M_3$ | $M_2$ | $a_1 X(t)$ | $a_2 X(t-1)$ | $a_3 X(t-1)$ | $a_4 X(t-3)$ | $a_1 X(t)+a_2 X(t-1)+a_3 X(t-2)+a_4 X(t-3)$ |
| $T_2$ | $X(t-1)$ | $X(t)$ | $X(t-3)$ | $X(t-2)$ | 0 | 0 | 1 | 0 | $M_2$ | $M_1$ | $M_4$ | $M_3$ | $a_1 X(t)$ | $a_2 X(t-1)$ | $a_3 X(t-2)$ | $a_4 X(t-3)$ | $a_1 X(t)+a_2 X(t-1)+a_3 X(t-2)+a_4 X(t-3)$ |
| $T_3$ | $X(t-2)$ | $X(t-1)$ | $X(t)$ | $X(t-3)$ | 0 | 1 | 0 | 0 | $M_3$ | $M_2$ | $M_1$ | $M_4$ | $a_1 X(t)$ | $a_2 X(t-1)$ | $a_3 X(t-2)$ | $a_4 X(t-3)$ | $a_1 X(t)+a_2 X(t-1)+a_3 X(t-2)+a_4 X(t-3)$ |
| $T_4$ | $X(t-3)$ | $X(t-2)$ | $X(t-1)$ | $X(t)$ | 1 | 0 | 0 | 0 | $M_4$ | $M_3$ | $M_2$ | $M_1$ | $a_1 X(t)$ | $a_2 X(t-1)$ | $a_3 X(t-2)$ | $a_4 X(t-3)$ | $a_1 X(t)+a_2 X(t-1)+a_3 X(t-2)+a_4 X(t-3)$ |
| $T_1$ | $X(t)$ | $X(t-3)$ | $X(t-2)$ | $X(t-1)$ | 0 | 0 | 0 | 1 | $M_1$ | $M_4$ | $M_3$ | $M_2$ | $a_1 X(t)$ | $a_2 X(t-1)$ | $a_3 X(t-2)$ | $a_4 X(t-3)$ | $a_1 X(t)+a_2 X(t-1)+a_3 X(t-2)+a_4 X(t-3)$ |